United States Patent [19]
Sasaki et al.

[11] Patent Number: 5,213,654
[45] Date of Patent: May 25, 1993

[54] VAPOR-PHASE EPITAXIAL GROWTH METHOD FOR SEMICONDUCTOR CRYSTAL LAYERS

[75] Inventors: Masahiro Sasaki, Yokohama; Yoshito Kawakyu, Kawasaki; Hironori Ishikawa, Tokyo; Masao Mashita, Yokohama, all of Japan

[73] Assignee: Kabushiki Kaisha Toshiba, Kawasaki, Japan

[21] Appl. No.: 701,865

[22] Filed: May 17, 1991

[30] Foreign Application Priority Data

May 18, 1990 [JP] Japan ................. 2-128354

[51] Int. Cl.$^5$ ............................. C30B 25/00
[52] U.S. Cl. .................... 156/614; 156/610; 156/611; 156/612; 156/613; 156/DIG. 73; 156/DIG. 80; 156/DIG. 102; 156/DIG. 103
[58] Field of Search ........... 156/610, 611, 612, 613, 156/614, DIG. 73, DIG. 80, DIG. 102, DIG. 103

[56] References Cited

U.S. PATENT DOCUMENTS

| | | | |
|---|---|---|---|
| 4,234,355 | 11/1980 | Meinders | 156/DIG. 73 |
| 4,343,832 | 8/1982 | Smith et al. | 156/DIG. 73 |
| 4,737,233 | 4/1988 | Kamgar et al. | 156/DIG. 73 |
| 4,855,013 | 8/1989 | Ohta et al. | 156/611 |
| 4,859,625 | 8/1989 | Matsumoto | 156/613 |
| 4,975,252 | 12/1990 | Nishizawa et al. | 118/688 |

OTHER PUBLICATIONS

"Photolysis-Assisted OMVPE Growth of CdTe"; Kisker et al; *Materials Letters* vol. 3, No. 12; pp. 485–488.

Extended Abstracts of the 36th Spring Meeting of the Japan Society of Applied Physics and Related Societies, Chiba, Mar., 28a-Y4, Y. Sakuma et al, p. 243.

Extended Abstracts of the 36th Spring Meeting of the Japan Society of Applied Physics and Related Societies, Chiba, Mar., 28a-Y7, S. Gato et al, p. 244.

*Primary Examiner*—Robert Kunemund
*Assistant Examiner*—Felisa Garrett
*Attorney, Agent, or Firm*—Oblon, Spivak, McClelland, Maier & Neustadt

[57] ABSTRACT

A vapor-phase epitaxial growth method for group III–V compound semiconductor crystal layers by which alternating layers of (InAs)1 and (GaAs)1 are grown on an InP substrate by means of vapor-phase epitaxy while different material gases are supplied alternately. The substrate is irradiated with excimer laser light when a specific layer of the crystal layers is grown, thereby controlling the thickness of the specific crystal layer on a monoatomic scale.

26 Claims, 2 Drawing Sheets

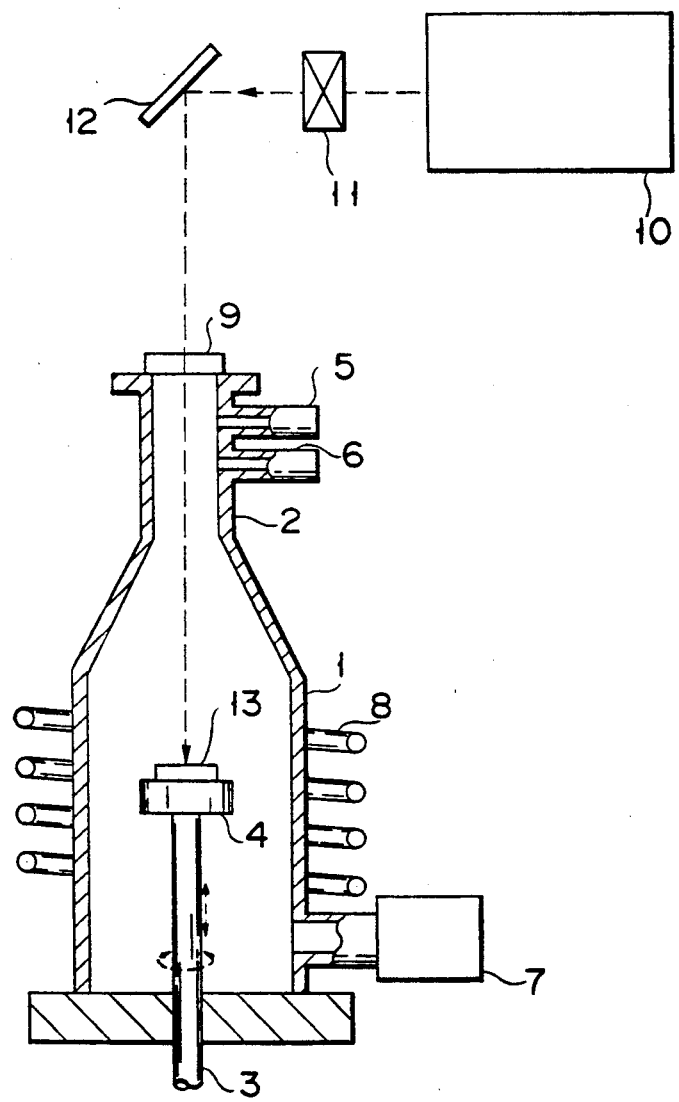
F I G. 1

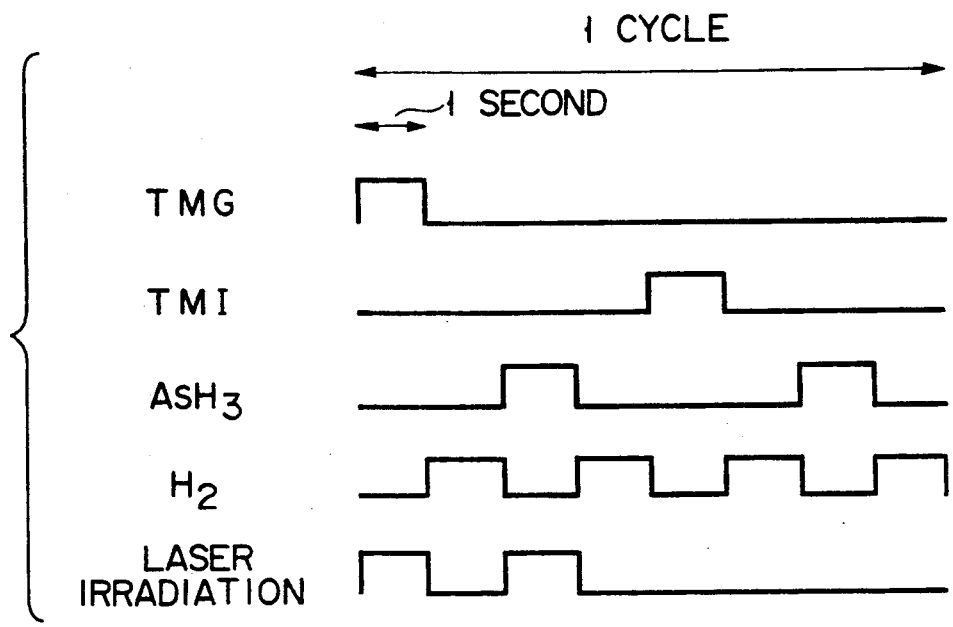
F I G. 2
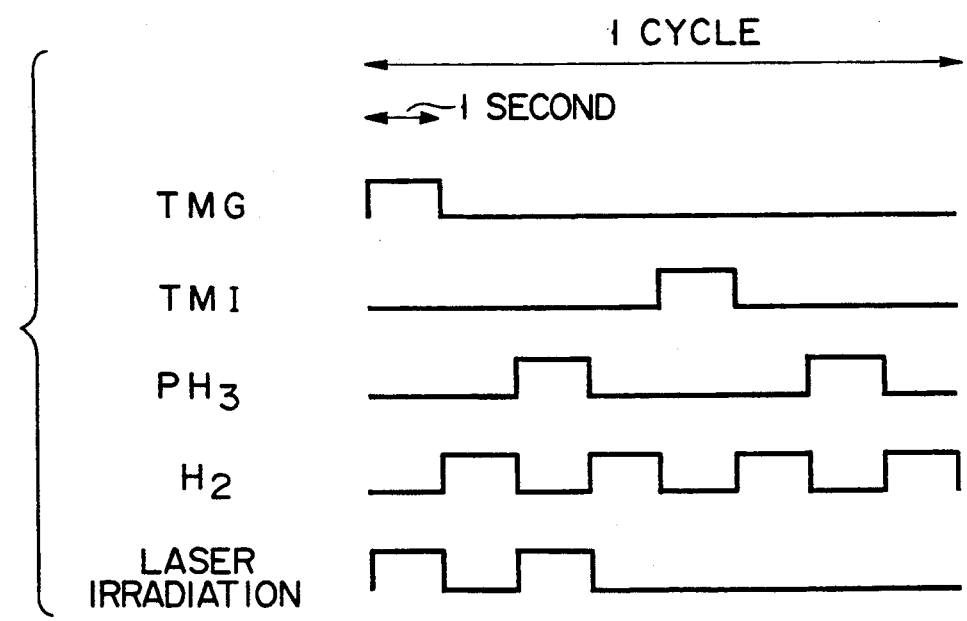
F I G. 3

VAPOR-PHASE EPITAXIAL GROWTH METHOD FOR SEMICONDUCTOR CRYSTAL LAYERS

BACKGROUND OF THE INVENTION

1. Field of the Invention

The present invention relates to a method of growing semiconductor layers by mean of vapor-phase epitaxy and, more particularly, to a vapor-phase heteroepitaxial growth method of growing different kinds of semiconductor layers one on top of the other while controlling the thickness of each semiconductor layer monoatomic scale.

2. Description of the Related Art

New functional devices employing quantum well structures have actively been developed recently. In order to make such devices, it is required to control the thickness of each of crystal layers with accuracy of the order of a monoatomic layer. The metal-organic chemical vapor deposition (MOCVD) method is known as a method of making such crystal layers. With the MOCVD method, however, it is difficult to control the thickness of a crystal layer on a monoatomic scale because it controls the thickness of a layer by means of its growth time alone.

For this reason, for the growth of, for example, III-V compound semiconductor layers, a monoatomic layer growth (which means a growth of a crystal layer with thickness controlled on a monoatomic scale) method has been proposed which introduces a group III material gas and a group V material gas alternately into vessel in which a substrate is placed, thereby growing alternating monoatomic like layers on the substrate. This method is now being studied energetically. The point of such a monoatomic layer growth method is that the growth self-stopping mechanism of the group III elements must be manifested in the thickness of a monoatomic layer. To this end, growth conditions, the substrate temperature in particular, must be set in such a way to suppress decomposition in vapor phase of the group III material and accelerate its decomposition and reaction at the substrate surface. The crystallinity of the resultant crystals and the quantities of introduced impurities vary significantly with the substrate temperature. Thus, a semiconductor crystal layer to be grown or a material gas used has a substrate temperature range suitable for the monoatomic layer growth. It is required to grow a semiconductor layer at a substrate temperature in the suitable temperature range.

In general, the temperature range which realizes the monoatomic layer growth and permits good film quality to be obtained varies in relation to semiconductor crystal layers or material gases. Thus, in order to grow different kinds of semiconductor layers subsequently by the use of the monoatomic layer growth technique, it is required to vary the substrate temperature for each of the semiconductor layers. However, it takes a long time to vary the substrate temperature. The growth has to be suspended for a long time at the interface between different kinds of semiconductor layers. The long-time suspension of the growth is liable to introduce impurities, thus degrading the properties of subsequently grown semiconductor layers.

That is, the problem with the conventional monoatomic layer growth method by which different kinds of semiconductor layers are subsequently grown is that the resultant semiconductor layers are poor in quality.

SUMMARY OF THE INVENTION

It is therefore an object of the present invention to obtain good-quality semiconductor crystal layers by growing different semiconductor layers subsequently on a substrate while controlling their thickness on a monoatomic scale.

According to the present invention there is provided a vapor-phase epitaxial growth method for growing different kinds of semiconductor crystal layers subsequently on substrate by means of vapor-phase epitaxy while supplying different material gases alternately, comprising the step of irradiating said substrate with light when a specific semiconductor crystal layer of said semiconductor crystal layers is grown, thereby controlling the thickness of said specific semiconductor crystal layer with accuracy of the thickness of a monoatomic layer.

The semiconductor crystal layers preferably comprise group III-V compound semiconductor crystals. For example, the semiconductor crystal layers comprise (InAs)m (GaAs)n (where each of m and n is an integer) and more preferably (InAs)1 (GaAs)1. As an alternative, the semiconductor crystal layers comprise (InP)m (GaP)n (where each of m and n is an integer) and more preferably (InP)1 (GaP)1. As the light use may be made of excimer laser light, halogen lamp light or infrared rays. The light is preferably applied to the substrate in the form of a beam.

According to the present invention, the energy of the light applied to the substrate has the following two actions.

The first is thermal action by which the temperature of the substrate surface or its neighborhood alone can be raised with virtually no time delay only when the substrate is irradiated with the light. When the irradiation of the substrate with the light is stopped, the substrate temperature returns to the same temperature as that is before the irradiation with virtually no time delay.

The second is direct action on chemical reactions by which surface reactions, such as absorption, decomposition, desorption, etc., are induced to accelerate the chemical reactions. By these actions, the substrate temperature range suitable for the monoatomic layer growth is shifted or enlarged. Thus, when semiconductor crystal layers with different substrate temperature ranges suitable for the monoatomic layer growth are subsequently grown on a substrate, application of light to the substrate at the time of the growth of a specific semiconductor crystal layer permits its substrate temperature range suitable for the growth of a monoatomic layer to be changed and the substrate temperature ranges of all the semiconductor crystal layers to be grown to overlap with each other. By setting the substrate temperature within the range which overlaps with each of the substrate temperature ranges suitable for the monoatomic layer growth, good-quality different kinds of semiconductor layers can be grown subsequently on the substrate with their thickness controlled on a monoatomic scale.

According to the present invention, in the growth of layers by alternating supply of materials, different kinds of semiconductor crystal layers with different optimum growth temperatures can be grown subsequently with their thickness controlled on a monoatomic scale.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagrammatic sectional view of a vapor-phase epitaxial growth apparatus used for a method according to an embodiment of the present invention; and FIG. 2 and FIG. 3 are diagrams illustrating sequences of the introduction of material gases and irradiation of light.

DETAILED DESCRIPTION OF THE PREFERRED EMBODIMENTS

Hereinafter, an embodiment of the present invention will be described with reference to the drawings taking the growth of (InAs)1 (GaAs)1 crystal layers on an InP substrate and the growth of (InP)1 (GaP)1 crystal layers on a GaAs substrate by way of example.

Referring to FIG. 1, a vapor-phase epitaxial growth apparatus has a growth vessel 1, or epitaxial reactor which is made of quartz and has an upper cylinder 2 formed integral with it. In the vessel 1, there is disposed a susceptor 4 which is caused by a driving shaft 3 to move up and down and rotate.

To the side wall of the cylinder of the vessel 1 are coupled gas-introducing tubes 5 and 6. Hydrogen or an inert gas is introduced into the vessel from the upper gas-introducing tube 5 coupled to the cylinder 2 so as to prevent the formation of a film on the under surface of a light-introducing window 9 (to be described later) which is disposed at the top of the cylinder 2. To the lower side wall of the vessel 1 is coupled an exhauster 7.

A radio-frequency heating coil 8 is wound around the growth vessel 1. Electric power supplied to the radio-frequency heating coil is controlled on the basis of comparison with temperature measured with a thermocouple (not shown) embedded in the susceptor 4.

In the figure, 10 denotes an excimer laser device. Light emitted from the laser device is applied to the substrate through a reflecting mirror 12 using a dielectric multilayer film and the light-introducing window 9 disposed on the top of the cylinder 2. On the light path there is disposed a shutter 11 for controlling the transmission of a laser beam from the laser device 10.

EXAMPLE 1

(InAs)1 (GaAs)1 crystal layers were grown on an InP substrate using the above-described epitaxial reactor.

In the first place, to clean the substrate, after a semi-insulating InP substrate 13 was placed on the susceptor 4, the exhauster 7 was operated to hold the pressure within the vessel at 20 Torr, hydrogen was introduced from the gas inlet 6 into the vessel at a rate of 1,000 sccm, PH$_3$ was introduced from the gas inlet 5 at a rate of 500 sccm, and the substrate was heated by the radio-frequency coil to 600° C. for 20 minutes.

Next, with the substrate temperature set at 350° C. by the radio-frequency heating device, hydrogen was introduced from the gas inlet 5, trimethylgallium (TMG), hydrogen, AsH$_3$, hydrogen, trimethylindium (TMI), hydrogen, AsH$_3$ and hydrogen were introduced from the gas inlet 6 into the vessel in this order, and an excimer laser beam was transmitted at the time of introduction of the TMG and at the time of introduction of AsH$_3$ immediately after the introduction of the TMG. In FIG. 2 there is shown a sequence of the introduction of the gases into the vessel and the irradiation of the substrate with a laser beam. The TMG and TMI were introduced with hydrogen as a carrier gas and AsH$_3$ was used diluted with hydrogen. The TMG, hydrogen, AsH$_3$, hydrogen, TMI, hydrogen, AsH$_3$ and hydrogen were each introduced for one second. The rates of introduction of TMG, AsH$_3$ and TMI were 0.1 sccm, 20 sccm and 0.1 sccm, respectively. The wavelength of excimer laser light was 248 nm, the intensity of the laser light was 25 mJ/cm$^2$ per pulse at the substrate surface and the pulse repetition rate was 100 Hz. During the growth, the pressure within the vessel was held at 20 Torr and the total flow rate of gases was maintained at 2500 sccm. The cycle of introduction of TMG, hydrogen, AsH$_3$, TMI, hydrogen, AsH$_3$ and hydrogen was repeated 2,000 times.

The observation of thus grown crystal layers by means of a scanning secondary-electron microscope revealed that each of the crystal layers irradiated with light was 1.17±0.02 μm in thickness and 2,000 layers of (InAs)1 (GaAs)1 were accurately formed within the accuracy of measurement. With the measurement of X-ray diffraction, satellite peaks corresponding to a superlattice of (InAs)1 (GaAs)1 layers were observed and the realization of the monoatomic layer growth wa confirmed. On the other hand, according to the observation with an optical interference microscope the surface morphology was very good.

For comparison, an experiment of the heteroepitaxial growth was tried without irradiation of the substrate with excimer laser light. This experiment was conducted under the same conditions in flow rates of gases and sequence of introduction of the gases as in the above experiment with the substrate temperature changed to 400° C., 450° C., 500° C. and 550° C. According to the experiment, grown crystal layers increased in thickness as the substrate temperature was increased. In either case, however, the film thickness was not uniform in plane and the growth of monoatomic layers was not realized. According to the measurement of X-ray diffraction the satellite peaks based on superlattice could not be observed for each of the grown crystal layers. According to the observation with an optical interference microscope, on the other hand, crystal layers grown at 450° C. or more were observed to have irregularities on their surfaces.

It is known that, where the excimer laser light is not used for the growth of crystal layers, the substrate temperature suitable for the growth of a monoatomic layer is 500° C. in the case of GaAs and 400° C. in the case of InAs. On investigation of the time required to change the substrate temperature from 400° C. to 500° C. or from 500° C. to 400° C., about 20 seconds were required until the substrate temperature reached within ±5° C. above and below the preset value. It will be understood that the growth of (InAs)1 (GaAs)1 requires 11 hours or more and changing the substrate temperature to fit a crystal layer to be grown is not practical. It is apparent that, even if a long time were spent in growing the (InAs)1 (GaAs)1, impurities, such as carbon, would be increased at its interface and the crystal quality would be degraded significantly.

EXAMPLE 2

(InAs)1 (GaAs)1 crystal layers were grown on an GaAs substrate using the above-described epitaxial reactor.

In the first place, to clean the substrate, after a semi-insulating GaAs substrate 13 was placed on the susceptor 4, the exhauster 7 was operated to hold the pressure within the vessel at 20 Torr, hydrogen was introduced from the gas inlet 6 into the vessel at a rate of 1,000 sccm, AsH$_3$ was introduced from the gas inlet 5 at a rate of 500 sccm, and the substrate temperature was held at 700° C. for 20 minutes.

Next, with the substrate temperature set at 380° C. by the radio-frequency heating device, hydrogen was introduced from the gas inlet 5, TMG, hydrogen, PH$_3$, hydrogen, TMI, hydrogen, PH$_3$ and hydrogen were introduced from the gas inlet 6 into the vessel in this order, and an excimer laser beam was applied to the substrate at the time of introduction of the TMG and at the time of introduction of PH$_3$ immediately after the introduction of the TMG. In FIG. 3, there is shown a sequence of the introduction of the gases into the vessel and the irradiation of the substrate with a laser beam. The TMG and TMI were introduced with hydrogen as a carrier gas and the PH$_3$ was used diluted with hydrogen. The TMG, hydrogen, AsH$_3$, hydrogen, TMI, hydrogen, AsH$_3$ and hydrogen were each introduced for one second, and the sequence of the introduction of the gases was repeated 2,000 times. During the growth, the pressure within the vessel was held at 20 Torr and the total flow rate of gases was maintained at 2500 sccm. The flow rate of the TMG, AsH$_3$ and TMI were set to be 0.1 sccm, 40 sccm and 0.1 sccm, respectively, The wave-length and intensity of the excimer laser light were set equal to those in the case of the growth of the (InAs)1 (GaAs)1.

As is the case with the above example of the growth of (InAs)1 (GaAs)1, an experiment was conducted on the growth of (InP)1 (GaP)1 with no laser light. According to the measurement of film thickness and X-ray diffraction, it was ascertained that only crystal layers irradiated with excimer laser light could realize the monoatomic layer growth.

EXAMPLE 3

Although, in the above examples, an excimer laser was used as a light source for applying light to the substrate, an experiment was also conducted on the growth of crystal layers using a halogen lamp.

To grow 2,000 layers of (InAs)1 (GaAs)1 on an InP substrate, use was made of a growth apparatus in which the laser 10 and the reflecting mirror 12 of the vapor-phase epitaxial growth apparatus used with the above examples were replaced with a 1-Kw halogen lamp with a condenser optical system and a total reflection mirror, respectively. The substrate temperature, the flow rates and introducing sequence of the material gases were set to be the same as in the above example 1. However, the intensity of the halogen lamp was set such that the substrate temperature was raised from 400° C. (when the substrate is not irradiated with light) to 500° C. as a result of irradiation of the substrate with light, the temperature being measured by the use of a pyrometer.

The film thickness of the grown semiconductor crystal layers was in agreement with 2,000 layers of (InAs)1 (GaAs)1. As a result of the measurement of X-ray diffraction, the satellite peaks of (InAs)1 (GaAs)1 were observed through they were smaller than in the case in which excimer laser light was applied. In other words, the monoatomic layer growth was ascertained. It will thus be appreciated that the halogen lamp provides the same effect as the excimer laser.

The energy beam used the monoatomic layer growth, like excimer laser light and halogen lamp light, has only to have functions of producing a rapid increase of the surface temperature of a substrate, electronic excitation of the substrate and a direct effect on the molecular mechanism of the substrate and need not take the form of a beam. For example, infrared rays may be used. An electron beam may be used under low pressure conditions below $10^{-4}$ torr.

Although, in the above examples, the monoatomic layer growth in (InAs)1 (GaAs)1 and (InP)1 (GaP)1 was described, the present invention may also be applied to multilayer semiconductor structures consisting of any combination of other III-V compound semiconductors, such as InAs/GaAs/AlAs, and other types of multilayer semiconductor structures.

On the basis of the fact that the (InAs)1 (GaAs)1 and (InP)1 (GaP)1 in the above examples are special forms of (InAs)m (GaAs)n and (InP)m (GaP)n (m and n are integers), any of (InAs)m (GaAs)n and (InP)m (GaP)n may be fabricated on condition that m and n are selected to permit lattice matching between a substrate and the adjacent semiconductor layer or between semiconductor layers.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A vapor-phase epitaxial growth method for sequentially growing first and second layers formed of semiconductor crystals of different kinds on a substrate positioned on a mount and in a process chamber, in which the second layer has an optimum growth temperature higher than that of the first layer, the method comprising the steps of:

growing the first layer by supplying a first material gas into the process chamber and heating the mount of a constant temperature; and growing the second layer by supplying a second material gas, which is different from the first material gas, into the process chamber, heating the mount at the constant temperature, and irradiating the substrate with light so as to apply the energy of the light to the substrate;

wherein the thickness of each of the first and second layers is controlled to an accuracy of a monoatomic layer.

2. A method according to claim 1, wherein a plurality of the first and second layers are grown alternately.

3. A method according to claim 2, wherein the first and second layers comprise group III-V compound semiconductor crystals.

4. A method according to claim 3, wherein the first and second layers comprise (InAs)m and (GaAs)n, respectively, in which each of m and n is an integer.

5. A method according to claim 4, wherein the first and second layers comprise (InAs)1 and (GaAs)1, respectively.

6. A method according to claim 3, wherein the first and second layers comprise (InP)m and (GaP)n, respectively, in which each of m and n is an integer.

7. A method according to claim 6, wherein the first and second layers comprise (InP)1 and (GaP)1, respectively.

8. A method according to claim 1, wherein the light is radiated in the form of a beam.

9. A method according to claim 4, wherein the first material gas comprises trimethylindium and $AsH_3$, and the second material gas comprises trimethylgallium and $AsH_3$.

10. A method according to claim 6, wherein the first material gas comprises trimethylindium and $PH_3$, and the second material gas comprises trimethylgallium and $PH_3$.

11. The method according to claim 8, wherein the light is as an excimer light.

12. The method according to claim 8, wherein the light is a halogen lamp light.

13. The method according to claim 8, wherein the light consists of infrared rays.

14. A vapor-phase epitaxial growth method for sequentially growing first and second layers formed of group III–V compound semiconductor crystals of different kinds on a substrate positioned on a mount and in a process chamber, in which the second layer has n optimum growth temperature higher than that of the first layer, the method comprising the steps of:

growing the first layer by heatig the mount at a constant temperature,, and supplying a first material gas containing a group III element and a second material gas containing a group V element successively and independently of each other into the process chamber; and growing the second layer by heating the mount at the constant temperature, irradiating the substrate with light so as to apply the energy of the light to the substrate, and supplying a third material gas containing a group III element which is different from the first material gas and a forth material gas containing a group V element successively and indepenently into the process chamber;

wherein the thickness of each of the first and second layers is controlled to an accuracy of a monoatomic layer.

15. A method according to claim 14, wherein hydrogen is supplied between supply of the first and second material gases, and between supply of the third and fourth material gases, respectively.

16. A method according to claim 14, wherein the first and second layers comprise (InAs)m and (GaAs)n, respectively, in which each of m and n is an integer.

17. A method according to claim 16, wherein the first and second layers comprise (InAs)1 and (GaAs)1, respectively.

18. A method according to claim 16, wherein the first and second material gases comprise trimethylindium and $AsH_3$, respectively, and the third and forth material gases comprise trimethylgallium and $AsH_3$, respectively.

19. A method according to claim 14, wherein the first and second layers comprise (InP)m and (GaP)n, respectively, in which each of m and n is an integer.

20. A method according to claim 19, wherein the first and second layers comprise (InP)1 and (GaP)1, respectively.

21. A method according to claim 19, wherein the first and second material gases comprise trimethylindium and $PH_3$, respectively, and the third and forth material gases comprise trimethylgallium and $PH_3$.

22. A method according to claim 14, wherein the light is radiated in the form of a beam.

23. A method according to claim 22, wherein the light is an excimer light.

24. A method according to claim 22, wherein the light is a halogen lamp light.

25. A method according to claim 22, wherein the light consists of infrared rays.

26. A method according to claim 14, wherein a plurality of the first and second layers are grown alternately.

* * * * *